United States Patent
Wik et al.

[11] Patent Number: 6,018,480
[45] Date of Patent: Jan. 25, 2000

[54] METHOD AND SYSTEM WHICH PERMITS LOGIC SIGNAL ROUTING OVER ON-CHIP MEMORIES

[75] Inventors: Thomas R. Wik, Livermore, Calif.; Myron Buer, Shakopee, Minn.; Robin Passow, Maple Plain, Minn.; Ken Redding, Maple Grove, Minn.

[73] Assignee: LSI Logic Corporation, Milpitas, Calif.

[21] Appl. No.: 09/057,188

[22] Filed: Apr. 8, 1998

[51] Int. Cl.[7] .................................................. G11C 7/00
[52] U.S. Cl. ........................... 365/190; 365/149; 365/51; 327/905
[58] Field of Search ................................... 365/190, 149, 365/51; 327/905

[56] References Cited

U.S. PATENT DOCUMENTS 5,136,543  8/1992  Matsuda et al. ......................... 365/190
5,821,592  10/1998  Hoenigschmid et al. ............... 257/390

Primary Examiner—David Nelms
Assistant Examiner—Hoai V. Ho
Attorney, Agent, or Firm—Conley, Rose & Tayon, PC; B. Noel Kivlin

[57] ABSTRACT

A method is provided for using twisted bit or signal lines and routing restrictions on the logic signal lines to pass logic signals over an on-chip memory. In one embodiment, the memory array includes complementary bitlines which are provided with periodic twists, and the logic signal routing is restricted in that logic signals are either routed perpendicular to the bit lines, or they are routed parallel to the bit lines in such a manner as to ensure equal coupling to both B and B'. The equal coupling is provided by either restricting the length of the logic signal line segment to an integral number of twist wavelengths, or by placing the logic signal line segment so that its midpoint rests on a twist centerline. In another embodiment, the memory array includes bitlines running parallel to a bitline axis, and complementary logic signal lines are routed in pairs. The logic signal routing is restricted in that logic signals are either routed perpendicular to the bitline axis, or they are routed parallel to the bitlines in such a manner as to ensure equal coupling to both B and B'. The equal coupling is provided by either placing a twist at the midpoint of the complementary logic signal line segment, or by placing periodic twists in the complementary logic signal line segment and restricting the length of the segment to an integer number of twist wavelengths.

10 Claims, 5 Drawing Sheets

METHOD AND SYSTEM WHICH PERMITS LOGIC SIGNAL ROUTING OVER ON-CHIP MEMORIES

BACKGROUND OF THE INVENTION

1. Field of the Invention

This invention relates to the field of integrated circuit chip design, and in particular to the design of application specific integrated circuits with on-chip memories.

2. Description of the Related Art

It is becoming commonplace to have integrated circuits on a monolithic chip which includes both logic circuitry and memory circuitry. One example of this would be a microprocessor with an on-chip instruction cache. The distinction between the two circuitry types is important in that logic circuitry tolerates and generates a significant amount of electronic noise, whereas high-density memory circuitry must be isolated from sources of electronic noise.

High density memories such as dynamic random access memory (DRAM) store information in the form of charges on a storage capacitor. The stored charge is very tiny (in the pico-farad range), and is detected by the change in voltage it induces on a bit line when the bit line is coupled to the storage capacitor. Electronic noise also induces changes in voltage on the bit line, and these changes may interfere with the detection of the stored charge, which will lead to errors when reading information from the memory.

Several approaches are used to minimize the effects of electronic noise. These include: distancing the memory circuitry from the logic circuitry, placing the memory in an isolation well, and forming a differential signal using two bit lines. In this last approach, a second complementary bit line B' is routed along side the first bit line B, and the voltage change detection is done between the two bit lines. Electronic noise is assumed to couple equally to both bit lines, and hence is canceled by measuring the voltage difference.

In the drive for increasing circuit densities, space is at a premium. The reduction of the actual physical area of the circuit places the logic circuitry in closer proximity to the memory circuitry, and the increased number of devices on the chip implies an increase in the number of electrical connections between devices. The routing of the electrical connections becomes more complex and consumes a greater amount of "routing space". To a large degree, the increased routing space is provided by increasing the number of routing layers, but some expansion can be obtained by increasing the available routing area of each layer.

The space over the memory has heretofore been considered inviolate. Routing logic signals over the memory introduces electronic noise and capacitive coupling in close proximity to the bit lines. Since the source of the electronic noise and capacitive coupling is no longer "far away", the induced voltage changes on bit lines B and B' are no longer the same, and hence no longer cancel out.

It is therefore desirable to provide a system and method which permits the routing of logic signals over an on-chip memory without interfering in the operation of the memory's read operations.

SUMMARY OF THE INVENTION

The problems outlined above are in large part solved by twisted bit or signal lines and routing restrictions on the logic signal lines which pass over the on-chip memory. In one embodiment, the memory array includes complementary bitlines which are provided with periodic twists, and the logic signal routing is restricted in that logic signals are either routed perpendicular to the bit lines, or they are routed parallel to the bit lines in such a manner as to ensure equal coupling to both B and B'. The equal coupling is provided by either restricting the length of the logic signal line segment to an integral number of twist wavelengths, or by placing the logic signal line segment so that its midpoint rests on a twist centerline. In another embodiment, the memory array includes bitlines running parallel to a bitline axis, and complementary logic signal lines are routed in pairs. The logic signal routing is restricted in that logic signals are either routed perpendicular to the bitline axis, or they are routed parallel to the bitlines in such a manner as to ensure equal coupling to both B and B'. The equal coupling is provided by either placing a twist at the midpoint of the complementary logic signal line segment, or by placing periodic twists in the complementary logic signal line segment and restricting the length of the segment to an integer number of twist wavelengths.

BRIEF DESCRIPTION OF THE DRAWINGS

Other objects and advantages of the invention will become apparent upon reading the following detailed description and upon reference to the accompanying drawings in which.

Figure 1:
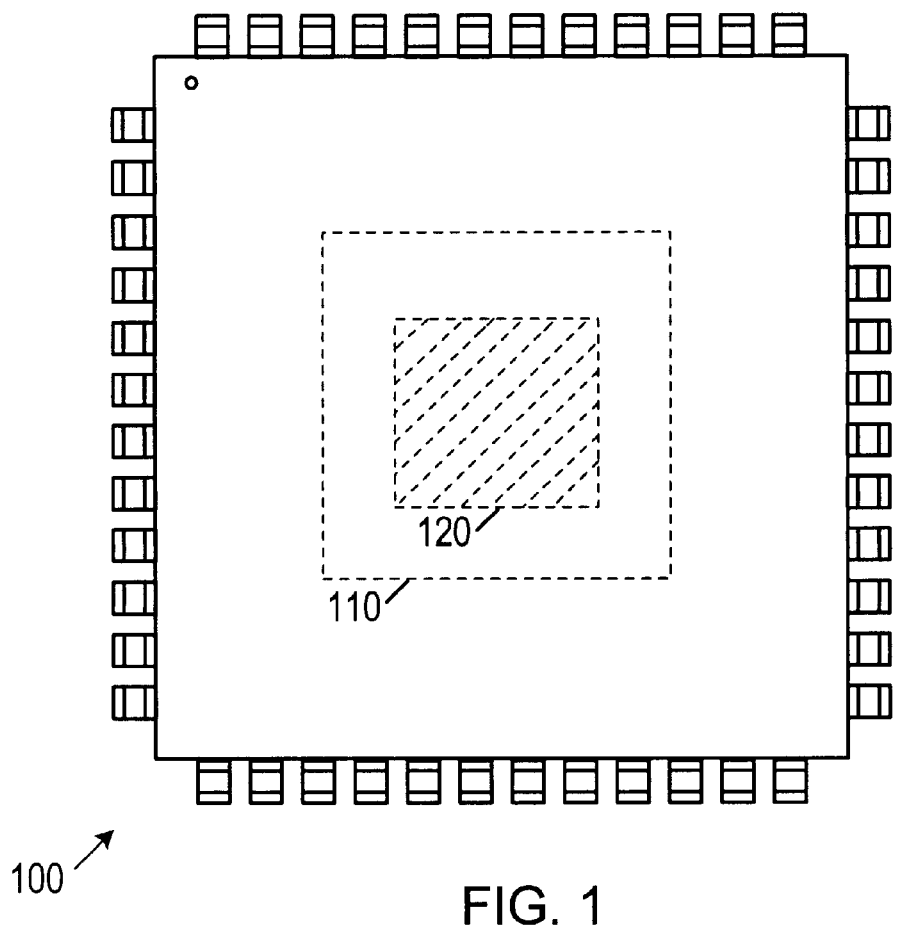
FIG. 1 is an integrated circuit chip which includes a memory array and a logic circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the figures, FIG. 1 shows an integrated circuit chip 100 having a cavity 110 which encloses a substrate having an integrated circuit 120. It is common for integrated circuit 120 to include various circuit modules which are coupled together to implement the function of integrated circuit 120. Circuit module types may be loosely characterized as: digital logic modules, analog circuit modules, information storage modules, and special purpose modules.

Digital logic modules (at the most basic level) comprise transistors coupled together to implement logic gates. These modules tend to be the source of many switching transients. Analog circuit modules comprise amplifiers and impedances coupled together to form signal generation and conditioning functions. These modules tend to generate a lot of heat.

Information storage modules comprise arrays of storage elements which are packed as tightly as possible. Dynamic random access memories (DRAMs) are the most popular memory storage arrays, and they tend to be sensitive to operating conditions and electronic noise. Special purpose modules are modules built to exploit some physical property of the circuit or substrate, and these are mostly used for measurement sensing or filtering operations. These tend to occupy a relatively large area of the substrate and to require special purpose processing steps.

As the electronics industry moves toward higher integration levels, it becomes necessary to place circuit modules of differing types on a common substrate. Placing embedded DRAMs on a common substrate with logic circuit modules is particularly desirable, and many isolation techniques have been developed to enable this.

Figure 2:
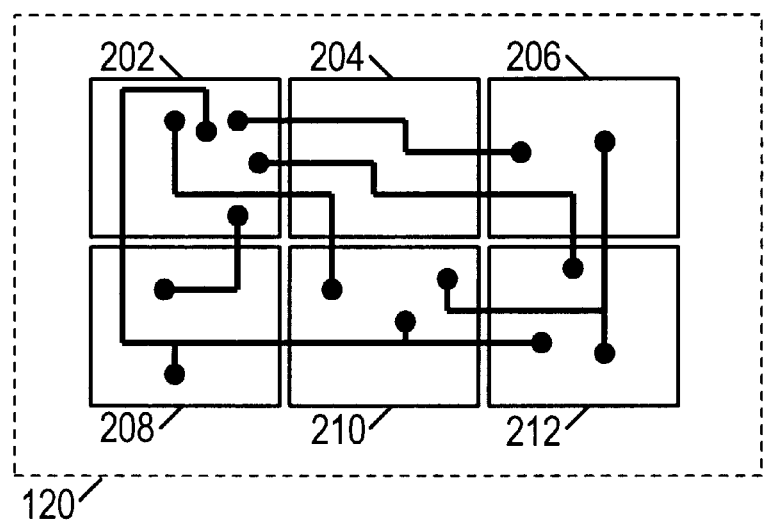
FIG. 2 is an integrated circuit comprised of coupled circuit modules one of which is an embedded DRAM.

Turning now to FIG. 2, an exemplary integrated circuit 120 is shown as being comprised of various circuit modules 202–212 coupled together via logic signal lines. Assuming, for the sake of illustration, that circuit module 204 is an embedded DRAM placed in maximally close physical proximity to the other circuit modules for high-performance reasons, then it may be observed how logic signal routing over the embedded DRAM provides a convenient routing solution. Logic signal routing from circuit module 202 to modules 206, 210, and 212 may then be accomplished without requiring that chip area be added for routing pathways around the perimeter and between the modules.

Figure 3:
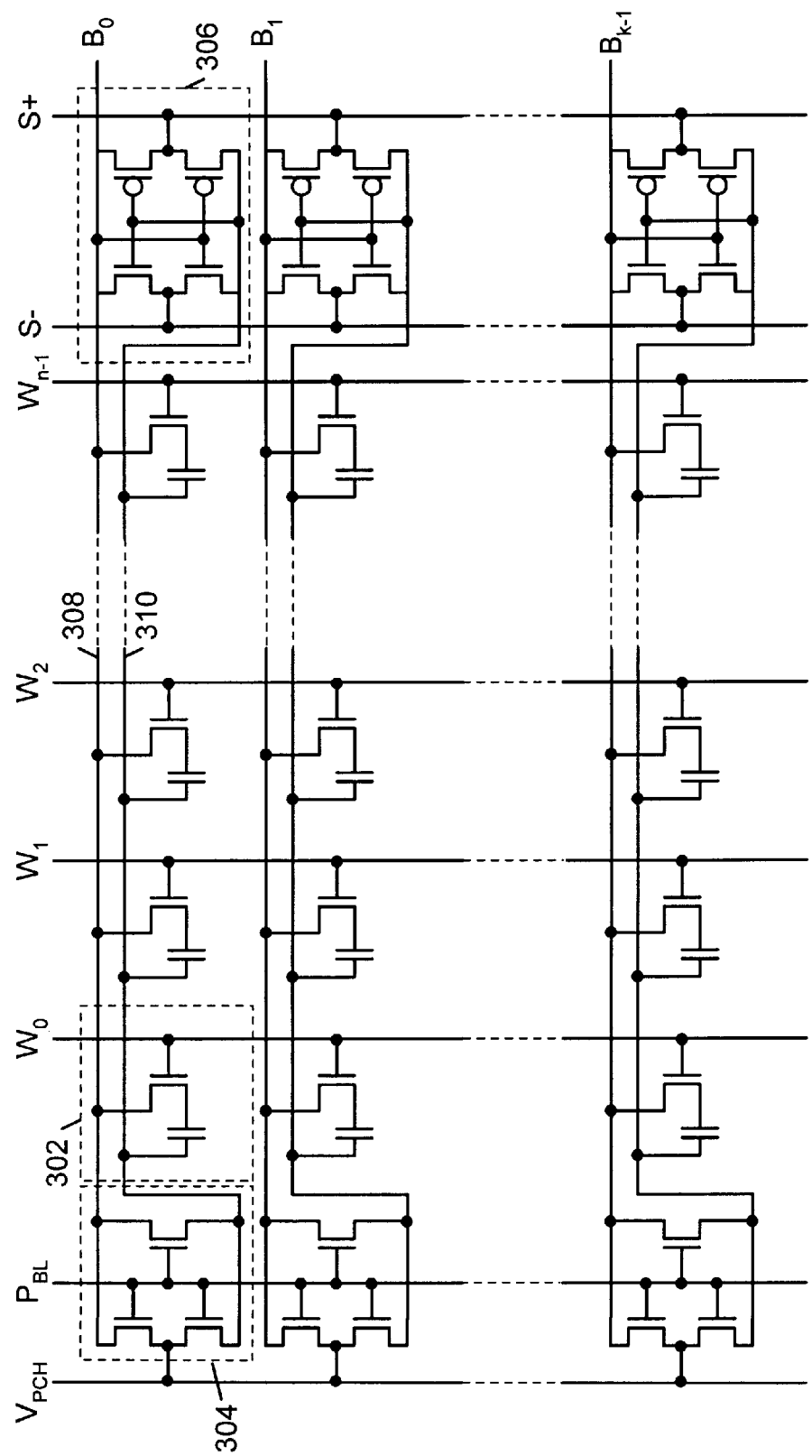
FIG. 3 is a schematic diagram of a DRAM array.

Turning now to FIG. 3, an exemplary embedded DRAM configuration is shown. In the configuration shown, a row of DRAM cells 302 is provided between a pre-charge circuit 304 and a sense amplifier 306. The DRAM cells in the row are coupled by bitlines 308 and 310. When a bitline pre-charge signal $P_{BL}$ is asserted, bitline 308 and complementary bitline 310 are charged to a pre-charge voltage $V_{PCH}$ by pre-charge circuit 304 in preparation for a sense operation on one of the DRAM cells in the row. After the pre-charge operation is completed (i.e. $P_{BL}$ is de-asserted), a sense operation is performed on one of the DRAM cells by asserting the corresponding word line (one of $W_0$–$W_{n-1}$), then applying power voltages $S_+$ and $S$ to sense amplifier 306. Asserting the word line couples the storage capacitor charge to the bitlines, thereby causing a voltage difference between the bitlines 308 (B) and 310 (B'). The sense amplifier 306 detects and amplifies this voltage difference to produce an output bit $B_0$. The DRAM array is comprised of k repetitions of the row circuitry whose operation has just been described.

Assuming that the bitlines are precharged to half the supply voltage, the voltage change caused on the bitlines may be determined from the following equation:

$$\Delta V_B = \frac{C_S V_S}{2C_T} + \frac{C_P V_P}{2C_T}, \text{ and } \Delta V_{B'} = -\frac{C_S V_S}{2C_T} + \frac{C_P V_P}{2C_T}$$

where $C_S$ is the capacitance of the storage capacitor, $V_S$ is the voltage stored on the storage capacitor, $C_P$ is the parasitic capacitance between the bitline and the signal line routed over the DRAM array, $V_P$ is the signal line voltage, and $C_T$ is the sum total of the capacitances coupled to the bitline. Additional signal lines will add additional terms to the sum, but one will suffice for the discussion here. Examining the above equation and recognizing that the stored voltage on the capacitor is subject to leakage between refresh operations, it is observed that when the parasitic capacitance becomes as large as a tenth of the capacitance of the storage capacitor, the voltage change on the bitline is heavily influenced by the voltage on the signal line.

Since each bitline B is provided with a complementary bit line B', as in the DRAM configuration of FIG. 3, the signal line will also have a parasitic coupling with the complementary bit line. If the coupling to the two bitlines is equal, then the voltage change induced by the signal line is common mode, i.e. it is the same on both the bitline and the complementary bitline, and may be removed by differential sensing between the bitlines. To ensure that the coupling to the two bitlines is equal, the following routing constraints are provided to allow routing of signal lines over embedded DRAM arrays:

(1) Signal lines may be routed perpendicularly to the axis in which complementary bitlines are run.
(2) Signal lines may be routed parallel to the axis in which complementary bitlines are run, subject to the following restrictions:
   (a) the complementary bitlines are provided with a twist, and
   (b) the twist is provided at the in the part of the bitline nearest the midpoint of the segment for which the signal line runs over the DRAM array parallel to the bitlines.
(3) Signal lines may be routed parallel to the axis in which complementary bitlines are run, subject to the following restrictions:
   (a) the complementary bitlines are provided with periodic twists, and
   (b) the length of the segment for which the signal line runs over the DRAM array parallel to the bitlines is equal to an integral number of twist wavelengths.

When signal lines are routed perpendicular to the bitlines, the signal line has the same coupling geometry with each of the bitlines, and the parasitic coupling to each of the bitlines is the same. When signal lines are routed parallel to the bitlines subject to constraint #2, the coupling geometry with the bitlines is symmetric about the midpoint of the signal line segment, and the twist at the midpoint ensures that each bitline experiences the same coupling geometry, and hence, the same parasitic capacitance. When signal lines are routed parallel to the bitlines subject to constraint #3, each of the bitlines runs equal distances in closer and farther proximities to the signal line segment, so that equal parasitic coupling is experienced by each.

Figure 4:
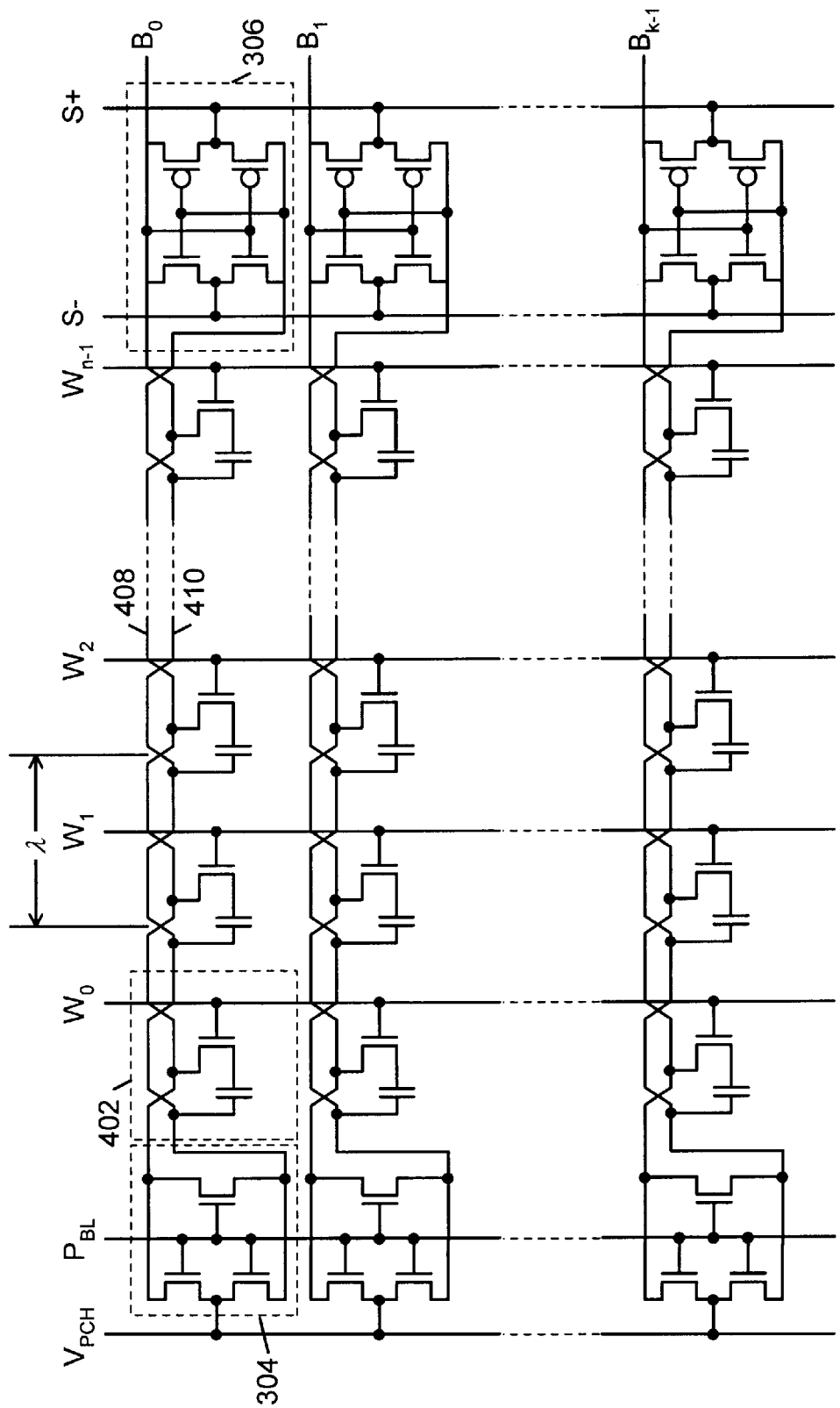
FIG. 4 is a schematic diagram of a DRAM array with twisted bitlines.

In FIG. 4, an exemplary DRAM array configuration having twisted bitlines 408, 410 suitable for usage with the above signal routing constraints. It operates in much the same way as the DRAM array of FIG. 3, but the complementary bitlines are provided with periodic twists. The twist wavelength $\lambda$ shown in FIG. 4 is equal to the width of a memory cell, but it is understood that this is not a requirement. Increasing the number of twists per unit length provides greater routing flexibility, while decreasing the number of twists per unit length will decrease the bitline capacitance per unit length.

Figure 5:
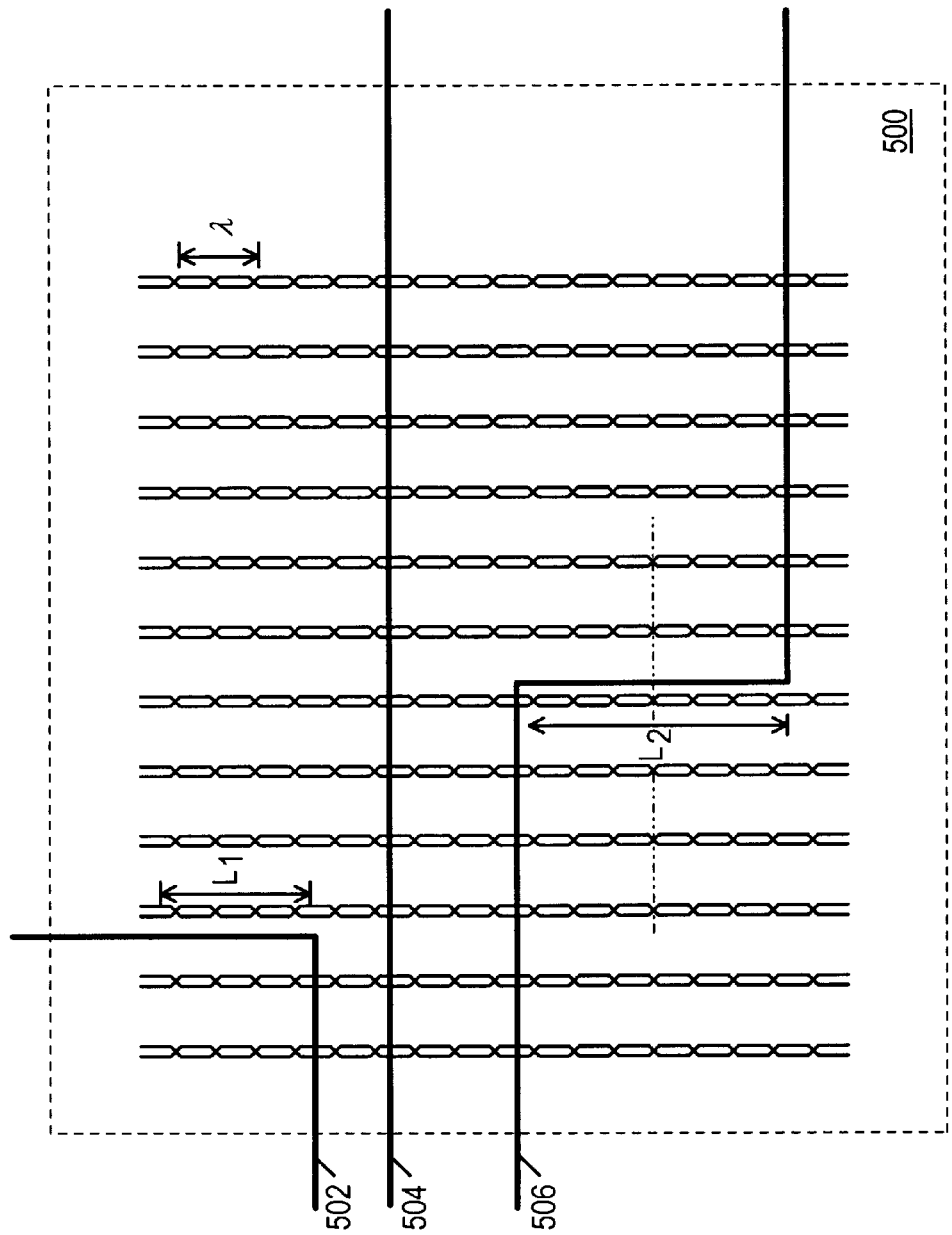
FIG. 5 is an illustration of signal lines routed over a DRAM array according to a set of routing constraints.

Turning now to FIG. 5, a DRAM array 500 is shown having twisted bitlines with a twist wavelength $\lambda$. For clarity, only the bitlines have been shown, and their relation to the remaining circuit components of the DRAM array may be determined from previous figures. A first signal line 502 is shown being routed over DRAM array 500. Signal line 502 enters from the left with a first segment running perpendicular to the axis of the bitlines, then makes a 90 degree turn with a second segment that runs parallel to the axis of the bitlines. According to the stated constraints, there is no restriction on the length of the first segment running perpendicular to the bitline axis. The second segment satisfies constraint #3, with a length $L_1$ equal to two twist wavelengths.

A second signal line 504 is shown being routed over DRAM array 500. Since the entire length of signal line 504 runs perpendicular to bitline axis, there are no restrictions on its placement relative to the bitlines. A third signal line 506 is shown being routed over DRAM array 500. Signal line 506 enters from the left with a first segment perpendicular to the bitline axis, a second segment parallel to the bitline axis, and a third segment perpendicular to the bitline axis. The first and third segments have no restrictions on their placement except as required for determining the placement of the second segment. The placement of the second segment satisfies constraint #2, since it extends equal distances from a segment centerline extending through a twist and perpendicular to the bitline axis. It is noted that the length $L_2$ of the second segment is not equal to an integral number of twist wavelengths. Rather $L_2$ equals 6.6 wavelengths, with 3.3 wavelengths on either side of the centerline which extends through a twist in each of the bitline pairs. In this case, the symmetry about a twist in the bitlines is important and the length is not.

The twisted bitlines in conjunction with the routing constraints provides a method for routing signal lines over DRAM arrays with complementary bitlines. It is noted that for DRAM arrays which do not employ complementary bitlines, signals lines may be routed over the DRAM arrays if they are provided with a complementary signal line, and the following constraints are followed:

(1) Complementary signal lines may be routed perpendicularly to the bitline axis.

(2) Complementary signal lines may be routed parallel to the bitline axis, subject to the following restrictions:
   (a) the complementary signal lines are provided with a twist, and
   (b) the twist is provided at the midpoint of the segment for which the complementary signal lines run over the DRAM array parallel to the bitline axis.

(3) Complementary signal lines may be routed parallel to the bitline axis, subject to the following restrictions:
   (a) the complementary signal lines are provided with periodic twists, and
   (b) the length of the segment for which the complementary signal lines run over the DRAM array parallel to the bitline axis is equal to an integral number of twist wavelengths.

When complementary signal lines are routed perpendicular to the bitlines, complementary signal lines have the same coupling geometry with each of the bitlines, and the parasitic coupling to each of the bitlines is equal (but opposite in polarity). When complementary signal lines are routed parallel to the bitlines subject to constraint #2, the coupling geometry with the bitlines is symmetric about the midpoint of the complementary signal line segment, and the twist at the midpoint ensures that each signal line provides the same coupling geometry with the bitline, and hence, the same parasitic capacitance. When complementary signal lines are routed parallel to the bitlines subject to constraint #3, each of the signal lines runs equal distances in closer and farther proximities to the bitlines, so that equal parasitic coupling is provided by each.

Figure 6:
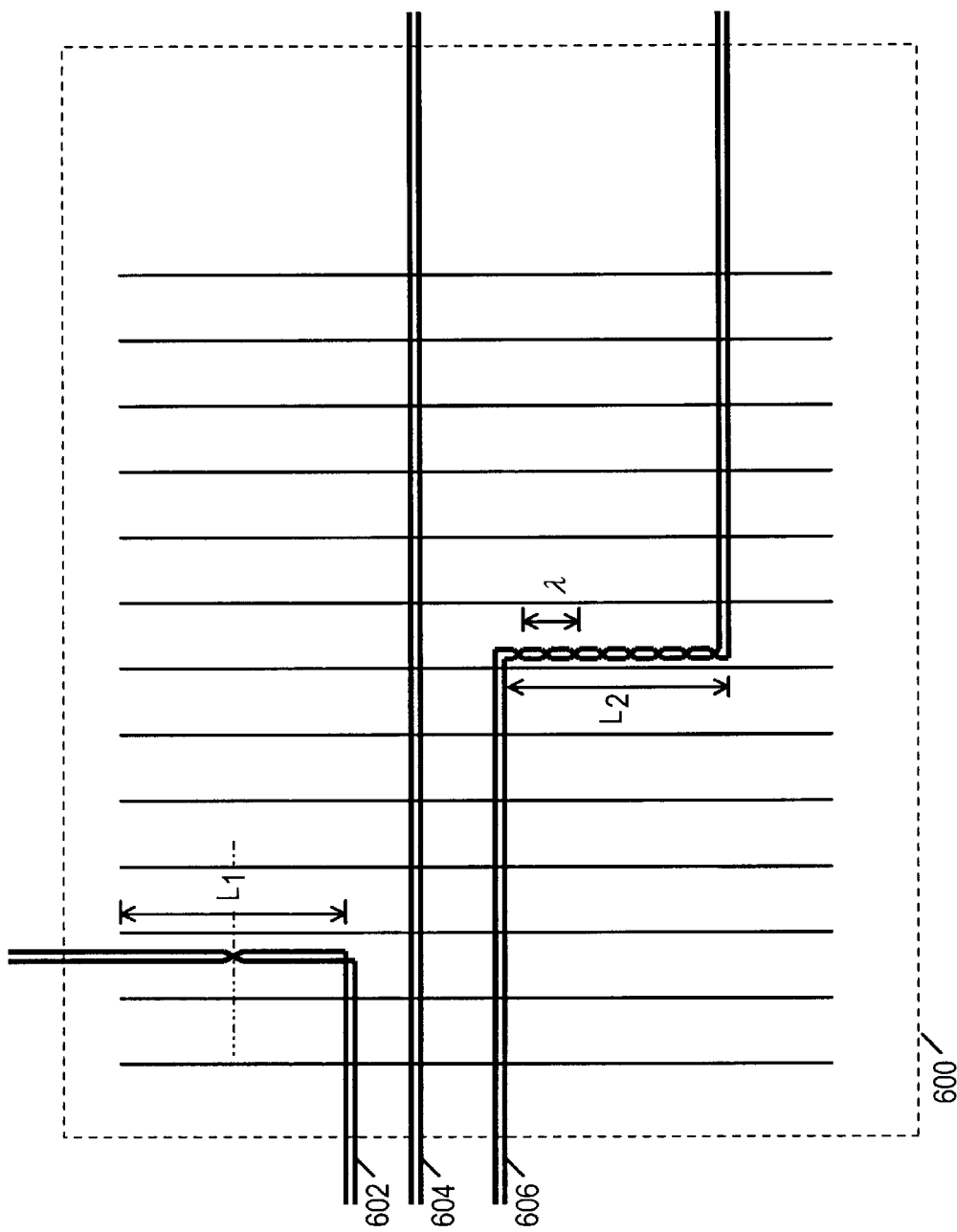
FIG. 6 is an illustration of complementary logic signal lines routed over a DRAM array according to a set of routing constraints.

Turning now to FIG. 6, a DRAM array 600 is shown having bitlines running parallel to a bitline axis. For clarity, only the bitlines have been shown. A first pair of complementary signal lines 602 is shown being routed over DRAM array 600. Complementary signal lines 602 enter from the left with a first segment running perpendicular to the bitline axis, then make a 90 degree turn with a second segment that runs parallel to the bitline axis. According to the stated constraints, there is no restriction on the length of the first segment running perpendicular to the bitline axis. The second segment satisfies constraint #2, since it extends equal distances from a twist at the midpoint of the segment $L_1$.

A second pair of complementary signal lines 604 is shown being routed over DRAM array 600. Since the entire length of complementary signal lines 604 runs perpendicular to bitline axis, there are no restrictions on their placement relative to the bitlines. A third pair of complementary signal lines 606 is shown being routed over DRAM array 600. Complementary signal lines 606 enter from the left with a first segment perpendicular to the bitline axis, a second segment parallel to the bitline axis, and a third segment perpendicular to the bitline axis. The first and third segments have no restrictions on their placement except as required for determining the length of the second segment. The length of the second segment satisfies constraint #3, since it is equal to an integral number (four) of twist wavelengths $\lambda$.

Numerous variations and modifications will become apparent to those skilled in the art once the above disclosure is fully appreciated. It is intended that the following claims be interpreted to embrace all such variations and modifications.

What is claimed is:

1. An integrated circuit which comprises:
   a memory cell array fabricated on a substrate, wherein the memory cell array includes bitlines routed parallel to a first axis; and
   a pair of logic signal lines routed over the memory cell array, wherein a second logic signal of said pair is complementary to a first logic signal of said pair;
   wherein the pair of logic signal lines is provided with a twist at a midpoint of a segment for which the pair of logic signal lines is routed over the memory array parallel to the first axis.

2. The integrated circuit as recited in claim 1, wherein the memory cell array is a dynamic random access memory.

3. The integrated circuit as recited in claim 1, wherein at least a portion of the pair of logic signal lines is routed perpendicular to the first axis.

4. The integrated circuit as recited in claim 1, further comprising a first logic circuit fabricated on the substrate adjacent to the memory cell array and coupled to drive the pair of logic signal lines.

5. An integrated circuit which comprises:
   a memory cell array fabricated on a substrate, wherein the memory cell array includes pairs of twisted bitlines routed parallel to a first axis; and
   a logic signal line routed over the memory cell array;
   wherein the logic signal line is routed parallel to the first axis and placed relative to a twisted bitline pair so as to ensure that a first bitline runs closer to the logic signal line for a distance equal to that which a complementary bitline runs closer to the logic signal line.

6. The integrated circuit as recited in claim 5, wherein each of the pairs of twisted bitlines is twisted in a spatially periodic fashion with a fixed spatial wavelength, wherein the logic signal line is routed parallel to the first axis for a total distance which equals an integer multiple of the fixed spatial wavelength.

7. The integrated circuit as recited in claim 5, wherein the memory cell array is a dynamic random access memory.

8. The integrated circuit as recited in claim 5, wherein at least a portion of the logic signal line is routed perpendicular to the first axis.

9. The integrated circuit as recited in claim 5, further comprising a first logic circuit fabricated on the substrate adjacent to the memory cell array and coupled to drive the logic signal line.

10. An integrated circuit which comprises:
- a memory cell array fabricated on a substrate, wherein the memory cell array includes bitlines routed parallel to a first axis; and
- a pair of logic signal lines routed over the memory cell array, wherein a second logic signal of said pair is complementary to a first logic signal of said pair;
- wherein the pair of logic signal lines are twisted in a spatially periodic fashion with a fixed spatial wavelength;
- wherein the pair of logic signal lines is routed parallel to the first axis for a total distance which equals an integer multiple of fixed spatial wavelength.

* * * * *